United States Patent
Reeck et al.

(10) Patent No.: US 6,885,554 B1
(45) Date of Patent: Apr. 26, 2005

(54) COOLING DEVICE FOR ELECTRICAL SUBASSEMBLIES

(75) Inventors: Guido Reeck, München (DE); Bruno Hoefer, Olching (DE); Alfred Gahse, Taufkirchen (DE)

(73) Assignees: Siemens Aktiengesellschaft, Münich (DE); W.L. Gore & Associates GmbH, Putzbrunn (DE)

(*) Notice: Subject to any disclaimer, the term of this patent is extended or adjusted under 35 U.S.C. 154(b) by 0 days.

(21) Appl. No.: 09/581,712
(22) PCT Filed: Dec. 9, 1998
(86) PCT No.: PCT/DE98/03621
§ 371 (c)(1), (2), (4) Date: Oct. 16, 2000
(87) PCT Pub. No.: WO99/31947
PCT Pub. Date: Jun. 24, 1999

(30) Foreign Application Priority Data

Dec. 16, 1997 (DE) .......... 197 55 944

(51) Int. Cl.⁷ .................. H05K 7/20
(52) U.S. Cl. .................. 361/695; 55/385.4
(58) Field of Search .............. 174/52.1, 16.1; 55/385.2, 486–488, 527–528, 385.4; 165/80.3, 121–126; 361/687, 690, 694–695; 454/184

(56) References Cited

U.S. PATENT DOCUMENTS

| | | | |
|---|---|---|---|
| 5,121,291 A | * | 6/1992 | Cope et al. .......... 361/695 |
| 5,395,411 A | | 3/1995 | Kobayashi |
| 5,409,419 A | | 4/1995 | Euchner et al. |
| 5,438,226 A | | 8/1995 | Kuchta |
| 5,477,417 A | | 12/1995 | Ohmori et al. |
| 5,484,012 A | | 1/1996 | Hiratsuka |
| 5,646,823 A | | 7/1997 | Amori |
| 5,886,296 A | | 3/1999 | Ghorbani et al. |
| 5,901,034 A | * | 5/1999 | Fuglister .......... 174/52.1 |
| 6,008,454 A | * | 12/1999 | Kawakita .......... 174/52.1 |

FOREIGN PATENT DOCUMENTS

| | | |
|---|---|---|
| DE | 2 211 268 | 9/1973 |
| DE | 31 47 970 | 7/1983 |
| DE | 42 34 919 | 11/1994 |
| DE | 36 24 541 | 5/1996 |
| DE | 196 26 778 | 1/1998 |
| EP | 0 089 401 | 9/1983 |

OTHER PUBLICATIONS

Japanese Office Action dated Aug. 23, 2002 for corresponding Japanese application No. 2000–539690.

(Continued)

*Primary Examiner*—Gregory D Thompson
(74) *Attorney, Agent, or Firm*—Staas & Halsey LLP

(57) ABSTRACT

The invention relates to an arrangement for cooling electrical subassemblies arranged in a housing, in particular for use in base stations of a mobile radio system or access network system. The arrangement has at least one water-repellent membrane filter, in each case arranged in an air inlet of the housing, for the surface filtration of dirt particles from cooling air flowing in for cooling electrical subassemblies, as well as at least one cooling device to build up an airflow and to lead the filtered cooling air, heated because of flowing through the subassemblies, out of the housing through at least one air outlet.

19 Claims, 6 Drawing Sheets

OTHER PUBLICATIONS

Chinese Office Action dated April 4, 2003 for corresponding Chinese application No. 98813650.3.

Japanese Office Action dated Dec. 27, 2001 for corresponding J Japanese application 2000–539690.

Translation of Korean Office Action for corresponding Korean Application No. 10–2000–7006630.

Japanese Document No. 9103662 published Apr. 22, 1997 (abs).

Japanese Document No. 9060936 published Mar. 4, 1997 (abs) and Fig. 1.

Japanese Document No. 3091996 published Apr. 17, 1991 (abs) Fig. 1.

Japanese Laid–open Patent No. Hei 3–34395 (abs).

Japanese Laid–open Patent No. Hei 60–183623 (abs).

Japanese Document No. 02–17852 published Jan. 22, 1990 (abstract).

Abstract of Japanese 06031130, published Feb. 8, 1994, *Patent Abstracts of Japan*, vol. 8, No. 248 (C–1198), May 12, 1994.

Hammer et al, "Ventilation System for Data Processing System", *IBM Technical Disclosure Bulletin*, vol. 17, No. 9, Feb. 1975, pp. 2529–2530.

\* cited by examiner

FRONT VIEW

Side View

COOLING DEVICE FOR ELECTRICAL SUBASSEMBLIES

BACKGROUND OF THE INVENTION

The invention relates to an arrangement for cooling electrical subassemblies arranged in a housing, in particular for use in base stations of a mobile radio system or access network system.

During operation, technical devices produce waste heat, which leads to the device heating up. Since a technical device can ensure its functionality only within a restricted temperature range, arrangements for cooling this device are normally provided.

In electrically operated devices, the power loss of components and subassemblies through which current flows leads to heating. If such technical devices are not installed in protected, temperature-controlled rooms, during operation attention must be paid not only to the permissible temperature range of the electrical subassemblies but, at the same time, also to the possible temperature range of the environment of the technical device. Both temperature ranges have to be taken into account when dimensioning the arrangement for cooling. Standard components for a technical device have, for example, a permissible operating temperature range of from 0 to 70° C. Components of this type are used, for example, in base stations of a mobile radio system or access network system, but also in other technical devices, such as traffic control devices or supply devices. Moreover, adequate protection from dirt particles and penetrating moisture must be ensured for the electrical components and subassemblies, above all when they are used outside closed rooms, it being necessary to comply with the protection regulations in accordance with the specified IP classes.

In base stations according to the prior art, such as is disclosed, for example, by the earlier German patent application 19626778.1, the problem of cooling the electrical components and subassemblies, with simultaneous protection from dirt and moisture, beginning from a specific IP class, is solved by using two cooling circuits separated by an air/air heat exchanger. In this arrangement, the atmosphere and the air stream produced by one or more fans in the interior of the base station are separated completely from the external ambient atmosphere. However, the complicated construction of the base station, containing two cooling circuits, has a detrimental effect on the costs, the volume and the weight of the base station. This construction also has the disadvantage that the cooling arrangement only operates at and above a specific temperature drop between the atmosphere in the interior of the base station and the ambient atmosphere, as a result of which the temperature in the interior is always above the temperature of the ambient atmosphere. In this case, under certain circumstances it may occur that the upper limiting temperature (for example 70° C.) of individual components or subassemblies is exceeded if the temperature of the ambient atmosphere exceeds the corresponding limiting temperatures. In general, it is true that: ambient temperature+heat-exchanger temperature difference $\Delta T$+internal heating !<component limiting temperature (e.g. 70° C.). In order to reduce the temperature difference $\Delta T$ needed for the cooling, a higher technical outlay is needed with a simultaneous increase in the volume of the base station or, alternatively, the use of so-called active cooling devices such as compressors, Peltier modules etc.

SUMMARY OF THE INVENTION

The invention is therefore based on the object of providing an arrangement for cooling which circumvents the above-described disadvantages of the arrangements according to the prior art.

This object is achieved by the arrangement for cooling electrical subassemblies arranged in a housing.

The arrangement according to the invention has at least one water-repellent membrane filter, in each case arranged in an air inlet of the housing, for the surface filtration of water and dirt particles from cooling air flowing in for cooling electrical subassemblies, as well as at least one cooling device to build up or crease an airflow in the housing and to lead the filtered cooling air, heated up because of flowing through the subassemblies, out of the housing through at least one air outlet.

The configuration of the arrangement according to the invention has the advantage that, by comparison with cooling arrangements according to the prior art, the interaction of the individual features permits a simpler construction of the cooling arrangement. In this case, in spite of the fact that only one cooling-air stream exists, instead of the two cooling circuits according to the prior art, optimum cooling of the electrical subassemblies is achieved with the required simultaneous protection of the subassemblies from dirt particles and penetrating moisture, and a higher temperature of the ambient atmosphere is permitted, because a temperature difference $\Delta T$ does not exist. As a result of the airflow built up by the cooling device, the cooling air heated in the subassemblies is led out of the housing and new cooling air flows into the housing from the ambient atmosphere through the membrane filter. In the process, the cooling air flowing in is freed of dirt particles in the membrane filter, by which means even strict protection regulations can advantageously be satisfied. The membrane filter is designed as a water-repellent surface filter, which advantageously prevents the penetration of dirt particles into the filter and thus permits simple cleaning.

In a first refinement, the arrangement according to the invention has air guide devices, respectively underneath and/or above the electrical subassemblies, to guide the filtered cooling air flowing in through one subassembly in each case and/or to shield the electrical subassemblies. These air guide devices advantageously achieve a homogenous distribution of the cooling air flowing in over the base surface of the respective electrical subassemblies, and thus the uniform cooling of the electrical subassemblies.

According to further refinements of the invention, the cooling device comprises a motor-driven fan wheel, the motor speed and thus the throughput of cooling air in the housing in addition being controlled by a control device as a function of the temperature in the housing and/or of the temperature of the ambient atmosphere, and thus of the temperature of the cooling air flowing in. By this means, for example, a constant operating temperature of the electrical subassemblies, and a constant temperature in the interior of the housing, can be ensured, and therefore the service life of the electrical subassemblies can advantageously be prolonged. Furthermore, the speed of the cooling device can in each case be controlled in such a way that the permissible limiting temperatures of the electrical subassemblies are just not exceeded, and the noise emission of the arrangement is minimized by the lowest possible speed of the cooling device.

Furthermore, by means of an appropriately configured cooling device, the direction of the airflow in the housing can be reversed, so that cooling air flows into the housing through the air outlet and is led out through the membrane filter, by which means dirt particles deposited on the surface of the membrane filter are advantageously removed.

According to a further refinement, the air inlet is arranged in the side and/or bottom area of the housing in such a way that the cooling air flowing in acts on the undersides of the subassemblies and therefore a flow through the subassemblies is advantageously made possible by the cooling air heated by flowing through the electrical subassemblies being sucked up by the cooling device and being led out through at least one air outlet arranged in the upper and/or side area of the housing.

The arrangement according to the invention is suitable, in particular, for use in base stations or similar outdoor installations of a mobile radio system or access network system, as well as in comparable technical devices such as traffic control devices, directional radio devices and the like, which have to be operational within a wide temperature range.

Exemplary embodiments of the invention will be explained in more detail with reference to the appended drawings, in which:

DESCRIPTION OF THE PREFERRED EMBODIMENTS

Figure 1:
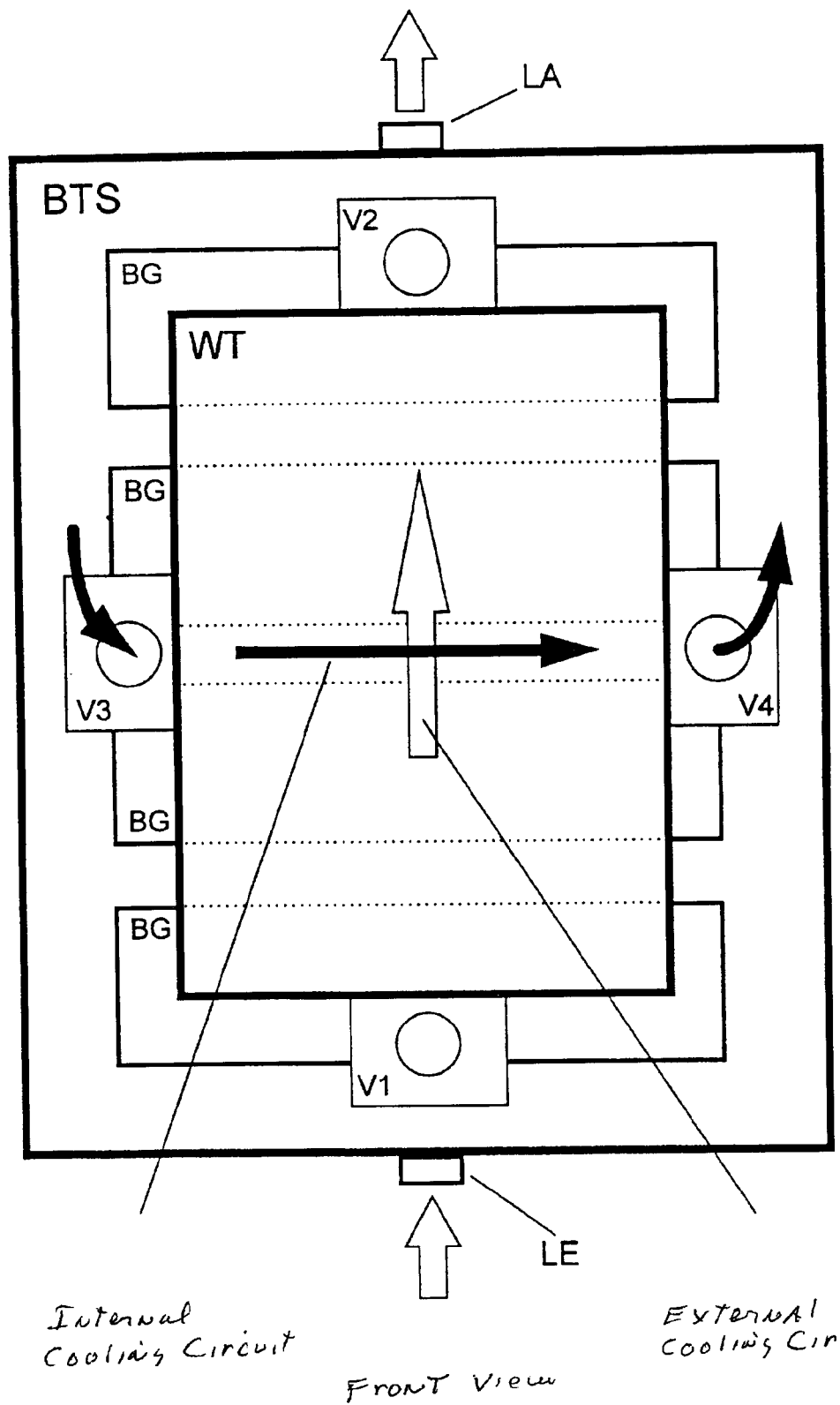
FIG. 1 shows a diagrammatic front view of a base station of a mobile radio system having a cooling arrangement according to the prior art.

The base station BTS, for example a mobile radio system according to the prior art device of FIG. 1, contains a number of electrical subassemblies BG. During the operation of the base station BTS, the power loss of the individual electrical subassemblies BG leads to heating, which gives rise to the necessity for cooling. The cooling is carried out by cooling devices VI–V4 incorporated in a number of cooling circuits.

These cooling circuits are two cooling circuits with one being an external circuit having an air flow identified by white arrows and an internal or second cooling circuit having an air flow identified by black arrows. The two cooling circuits are separated from each other by an air/air heat exchanger WT.

The external cooling circuit is implemented by two cooling devices V1 and V2. Air at the temperature of the ambient atmosphere is sucked into the base station BTS by the first cooling device V1 through an air inlet LE on one side of the base station BTS. The air is heated in the heat exchanger WT and is subsequently forced out by the second cooling device V2 from an air outlet LA on the opposite side of the base station BTS. This external cooling circuit extends, for example according to FIG. 1, in the vertical direction.

The second cooling circuit, which is located in the interior of the base station BTS, extends, through the heat exchanger WT in the horizontal direction. Here, two further cooling devices V3 and V4 implement the internal cooling circuit. Warm air is sucked out of the subassemblies BG, into the heat exchanger WT by the third cooling device V3. The warm air passes over the plates or ribs of the heat exchanger WT and, in so doing, gives up heat energy to these cooling plates or ribs and ultimately to the external cooling circuit. The fourth cooling device V4 in turn forces the cooled air into the subassemblies BG.

This divided cooling circuit carries the heat produced in the interior of the base station BTS away to the ambient atmosphere of the base station BTS. The cooling devices V1 to V4 used are generally known ventilators, since air exchange on the basis of natural convection is inadequate because of the considerable heating of the subassemblies.

The construction of the base station BTS with a divided cooling circuit leads to the already mentioned disadvantages, of high technical outlay, high costs, high weight, large volume and a necessary temperature difference $\Delta T$, which occurs disadvantageously, between the internal and external cooling circuits. The circuit always is warmer by $\Delta T$ than the cooling external circuit.

Figure 2:
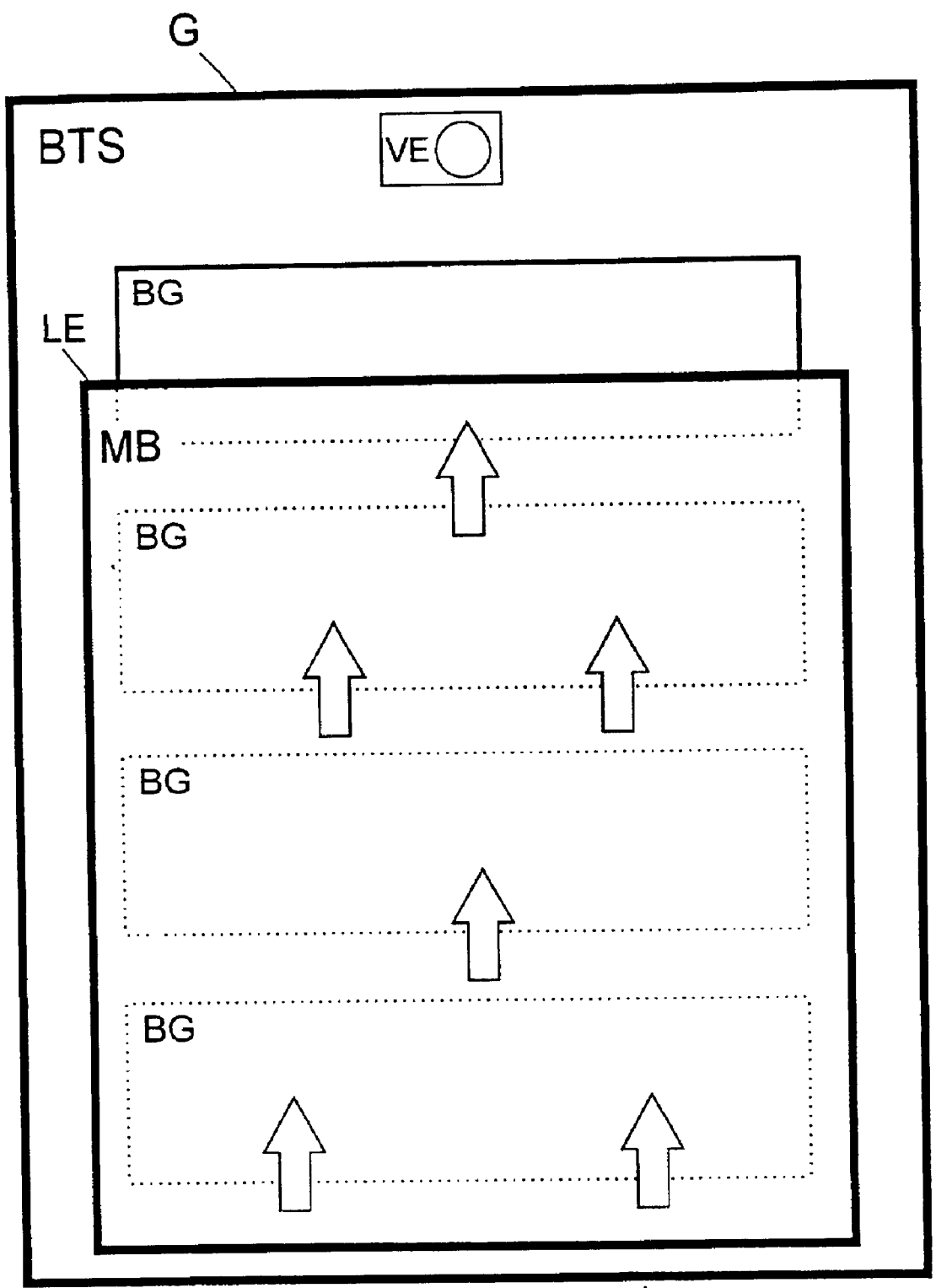
FIG. 2 shows a diagrammatic front view of an exemplary base station having the arrangement according to the invention for cooling electrical subassemblies.

FIG. 2 illustrates, likewise in a front view, a base station BTS having electrical subassemblies BG arranged as in the base station BTS according to the prior art. A membrane filter MB is arranged in an air inlet LE provided on the front of the housing G of the base station BTS, the air inlet LE being of such a size that cooling air flowing in through the membrane filter MB from the ambient atmosphere of the base station BTS can flow through the electrical subassemblies BG, in each case from below and, if appropriate, from the front, and thus effects the cooling of the subassemblies. The active area of the membrane filter MB, which, for example by means of forming folds, can be greater than the air inlet LE, is dimensioned such that the pressure drop of the cooling air flowing in through the cooling device VE can be compensated for or, in spite of the membrane filter MB being partly made up by dirt particles, sufficient cooling air can still flow in. A cooling arrangement VE arranged in the upper area of the housing G sucks up the cooling air heated as it flows through and around the electrical subassemblies BG, and carries it away to the ambient atmosphere through an air outlet LA (see FIG. 3).

Figure 3:
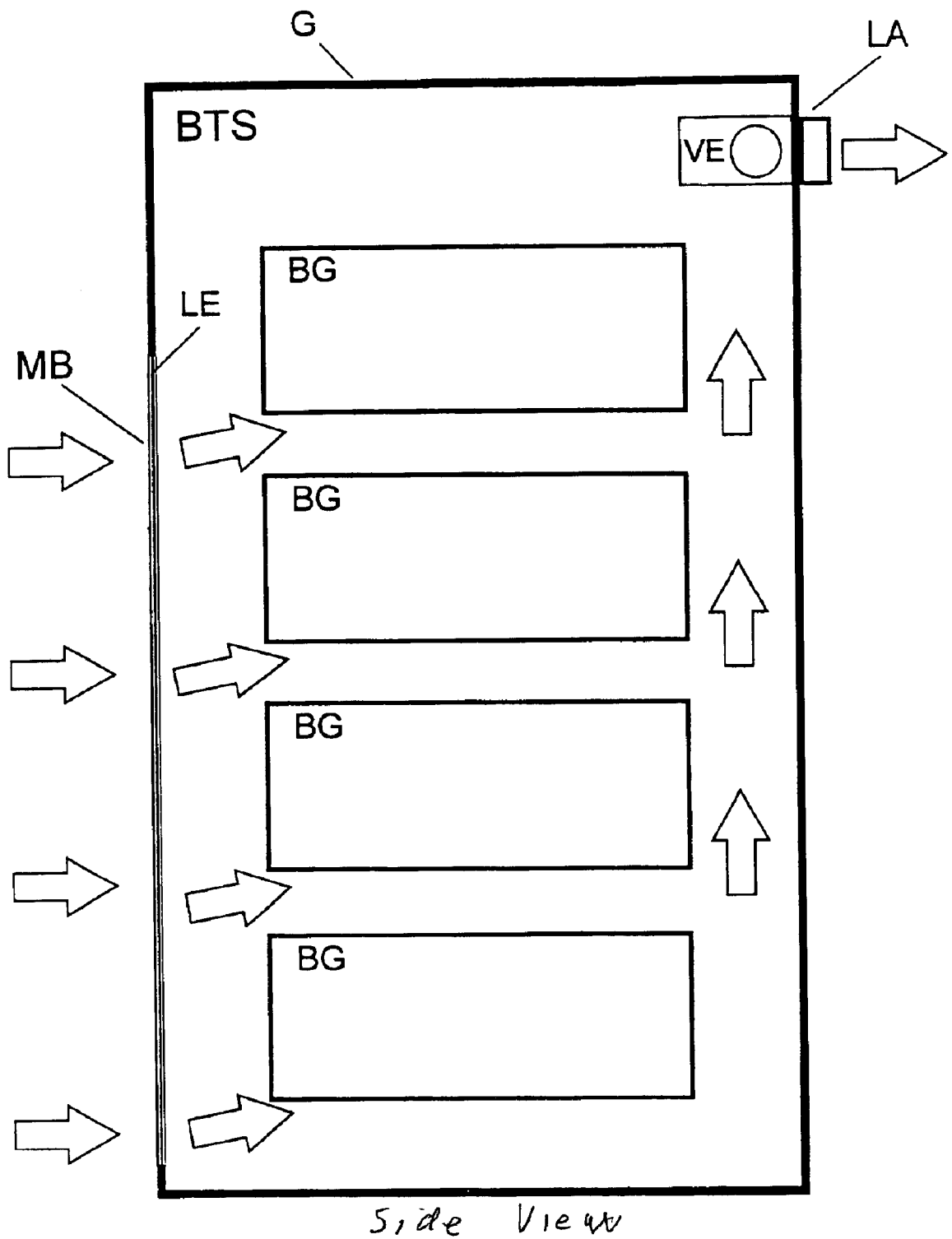
FIG. 3 shows a diagrammatic side view of an exemplary base station having an arrangement according to the invention for cooling electrical subassemblies.

FIG. 3 illustrates a side view of the base station BTS described in FIG. 2, in order to illustrate the exemplary internal construction in more detail. On the left-hand side of the housing G of the base station BTS, the membrane filter MB is arranged in the air inlet LE. The membrane filter MB is designed, for example, as a surface filter, which has the particularly advantageous property of separating dirt particles and water or moisture from the ambient atmosphere as early as at the surface of the membrane, by which means, for example, sensitive electronic modules or circuits in the subassemblies BG can be protected against such environmental influences. By means of special designs of the membrane filter MB, protection regulations following the IP guidelines up to IP55, for example, can be satisfied. Furthermore, the cooling of the subassemblies by causing cooling air to flow through the housing G has the direct advantage of a necessary temperature difference $\Delta T$ tending to zero between the temperature of the ambient atmosphere and thus the temperature of the cooling air flowing in and the temperature in the interior of the housing, by which means the operation of the electrical subassemblies BG is ensured even if the temperature of the ambient atmosphere of, for example, +70° C., which corresponds to the limiting temperature of the components, reduced by the level of internal heating (see above).

Cooling air sucked in by the cooling device VE, which is arranged, for example, in the rear upper area of the housing G, flows out of the ambient atmosphere, through the membrane filter MB, into the housing G of the base station BTS. As a result of the opposing arrangement of the air inlet LE and the air outlet LA, the filtered cooling air flows through the electrical subassemblies BG arranged in the housing G. As a result of the subassemblies BG being arranged at a specific distance from one another, the flow takes place in each case at least from the underside of the subassemblies BG and can additionally take place from the front side or from the side in the form of an enveloping flow. According to one known design, the subassemblies BG comprise, for example, a withdrawal-unit housing with electronic components and high-power circuits located in it. The withdrawal-unit housings are equipped with ventilation slots, through which cooling air can get to the components and circuits.

Figure 4:
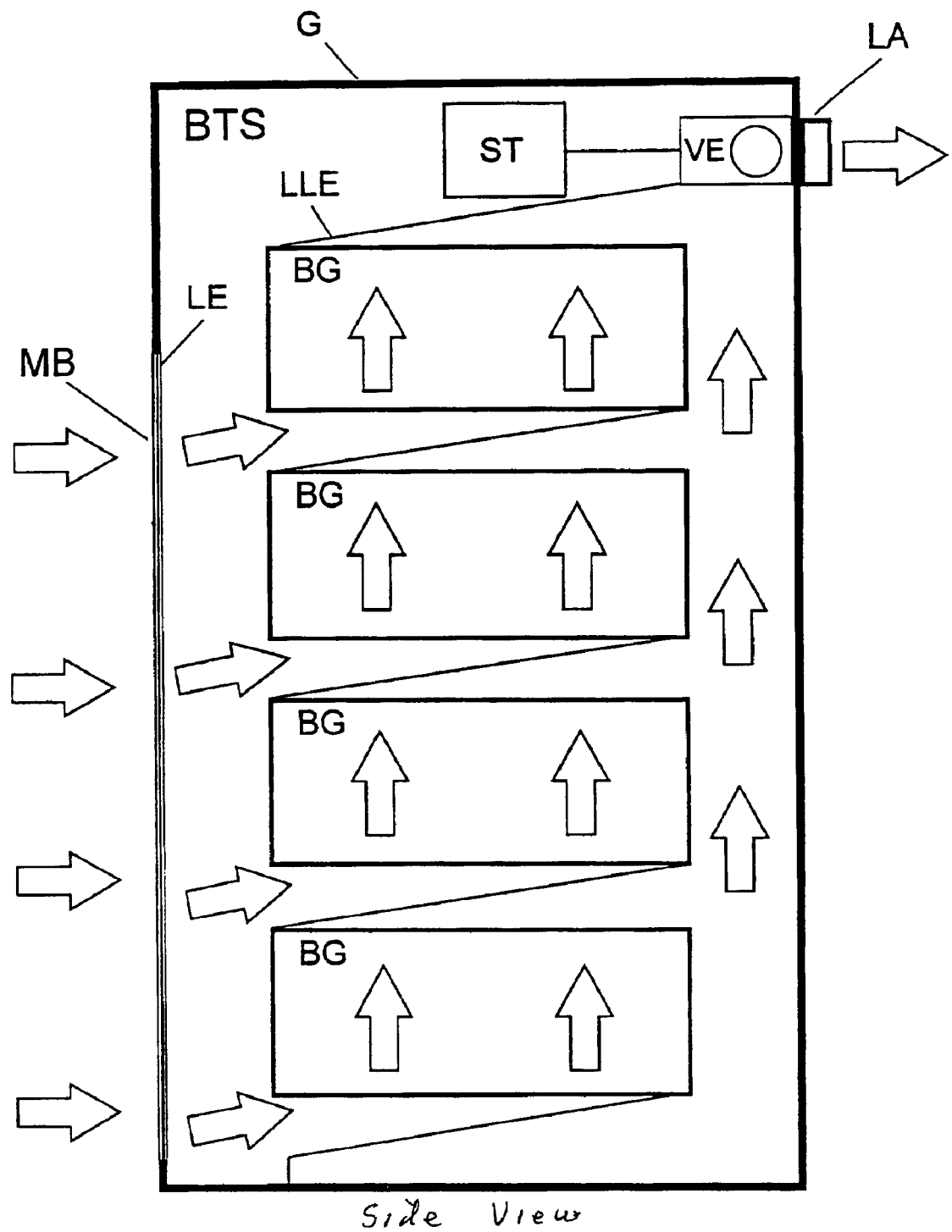
FIG. 4 shows a diagrammatic side view of an exemplary base station having an arrangement according to the invention for cooling electrical subassemblies with additional features.

The base station BTS in FIG. 4 has, in addition to the base station BTS in FIG. 3, air guide devices LLE, in each case in the spaces between the individual subassemblies BG and under the lowest and above the top subassembly BG. These air guide device LLE serve for the purpose of distributing the cooling air flowing in through the membrane filter MG uniformly over the base surface of the respective subassembly BG, so that a homogenous flow through the entire subassembly BG occurs. Moreover, the oblique arrangement means that the cooling air flowing in is led more directly to the subassemblies BG, and the cooling air heated in the subassemblies BG is led more directly to the cooling device VE. This arrangement advantageously prevents cooling air which has already been heated from flowing through one or more further subassemblies BG, and prevents any temperature peak occurring in some subassemblies BG. Furthermore, the air guide devices LLE can be used for the mutual shielding of the subassemblies BG from the point of view of satisfying protection regulations relating to electrical magnetic radiation.

In order to regulate the temperature in the interior of the housing G, the speed of the electric motor of the cooling device VE is controlled by a control device ST. In order to register parameters for this control, temperature sensors can be provided, for example in the area of the air inlet LE and at various points within the housing G, said sensors continuously determining the temperatures of the cooling air flowing in and of the atmosphere in the interior of the housing G. In this regulation system, the throughput of cooling air in the housing G is varied via the speed of the electric motor of the cooling device VE, in order, for example, to maintain a constant temperature in the interior of the housing G irrespective of the temperature of the ambient atmosphere. A constant operating temperature of the subassemblies BG has, for example, a positive effect on the operating lifetime of the electronic components and of the high-power circuits. In addition, keeping the speed of the cooling device VE constantly low, under the condition that the limiting temperature of +70° C. is not exceeded, permits the noise emission from the base station BTS to be minimized. Furthermore, in the case of a cold start of the base station BTS, the regulation system can refrain from operating the cooling device VE at the start, in order to permit the subassemblies to heat up rapidly to the desired operating temperature, and only to carry out further regulation of the speed of the cooling device VE to maintain the operating temperature after this operating temperature has been reached.

During a cold start, or else manually during maintenance of the base station BTS, the airflow in the housing can be reversed, for example by changing the position of the vanes of the fan wheel of the cooling devices VE, as a result of which cooling air flows into the housing G through the air outlet LA, and is led out through the membrane filter MB. In the process, dirt particles deposited on the surface of the membrane filter MB are detached, and cleaning of the membrane filter MB is therefore achieved. This cleaning operation can, for example, also be initiated by means of a continuous measurement of the air throughput as a function of the speed of the cooling arrangement VE, being initiated when a throughput falls below a permanently defined value, the measured ratio indicating the degree of soiling of the membrane filter MB.

Figure 5:
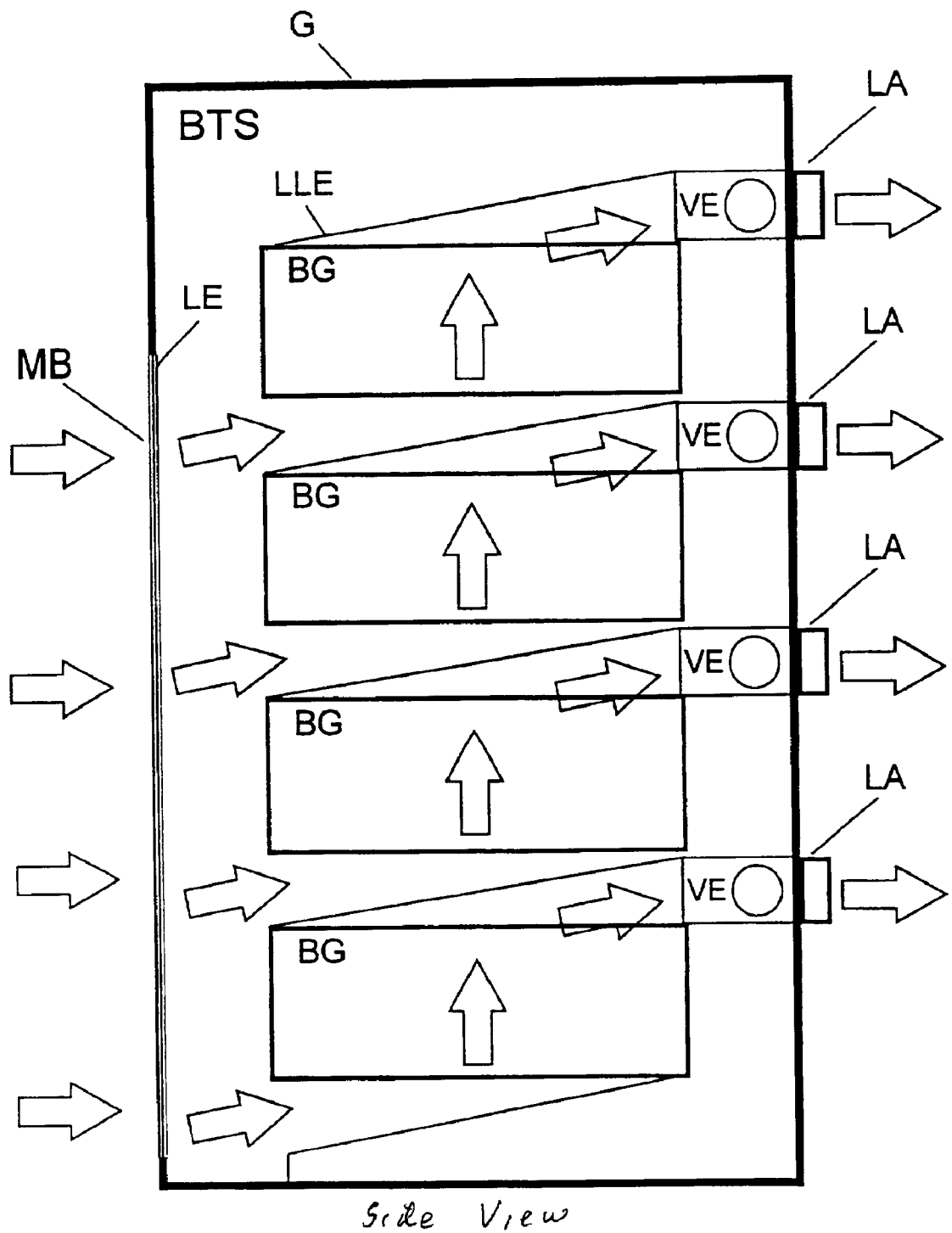
FIG. 5 shows a diagrammatic an exemplary base station having an arrangement according to the invention for cooling electrical subassemblies with a number of cooling devices.

FIG. 5 shows a base station BTS in which, differing from the base station BTS in FIG. 4, a cooling device VE having an air outlet LA in each case is respectively arranged above each electrical subassembly BG. The cooling air heated by flowing through the subassembly BG is led directly to the cooling devices VE by the air guide device LLE respectively arranged above a subassembly BG. This arrangement provides the advantage that, in the event of any possible failure of a cooling devices VE, and the switching off of the respective subassembly BG needed as a result because of the risk of overheating, all the further subassemblies BG can continue to remain in operation. Therefore, in this case the operation of the major part of the receiving paths or transmitting paths of the base station BTS can be ensured by the subassemblies BG set up in parallel for each path. For the area which the base station BTS supplies, the result is only an insignificant restriction on the performance capacity by comparison with complete failure of the base station BTS in the event of a malfunction of the individual cooling arrangement VE according to FIGS. 2, 3 and 4.

Figure 6:
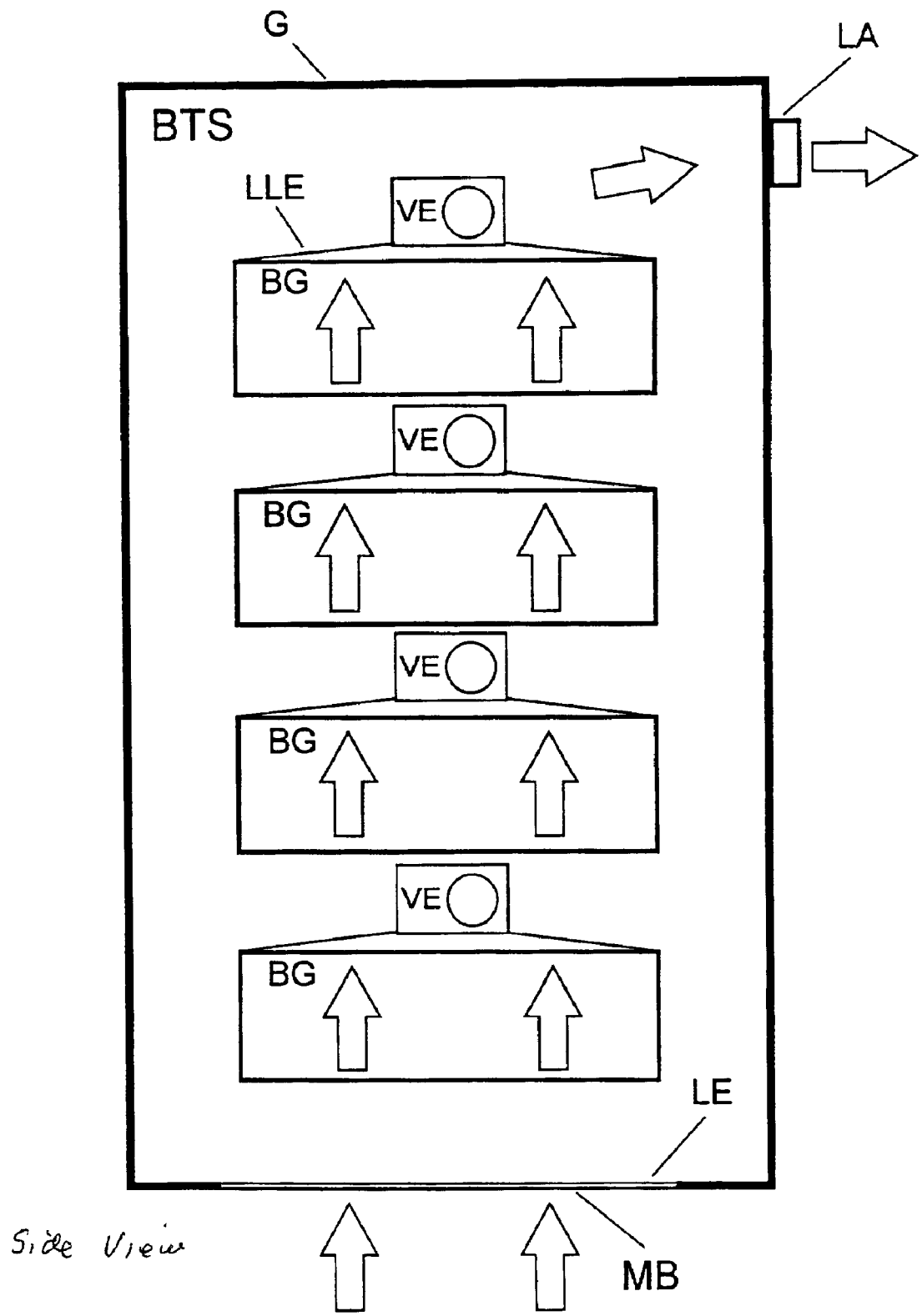
FIG. 6 shows a diagrammatic view of an exemplary base station having an arrangement according to the invention for cooling electrical subassemblies with a number of cooling devices in a modified arrangement.

FIG. 6 shows a further embodiment of the arrangement according to the invention in a base station BTS. In this embodiment, the air inlet LE and, correspondingly, the membrane filter MB are arranged on the underside of the housing G of the base station, as a result of which the cooling air flowing in acts directly on the undersides of the subassemblies BG. Cooling devices VE in each case arranged above the subassemblies BG build up an airflow. The cooling air heated as a result of flowing through the respective subassembly BG is fed directly to the cooling device VE by an air guide devices LLE of funnel-like design. The cooling air thus flows successively through all the subassemblies in the form of a series cooling system, and is led out at an air outlet LA arranged above the top subassemblies BG.

Otherwise, both the air inlet LE and the respective air outlet LA can be arranged on any side of the housing G of the base station BTS.

We claim:

1. A cooling arrangement for an apparatus having a housing containing electrical subassemblies, comprising:
    at least one water-repellent membrane filter having a surface arranged in an air inlet of the housing for surface filtration of dirt particles and water from cooling air flowing into the housing for cooling the electrical subassemblies, said surface filtration of dirt particles and water occurring at the surface of said at least one water repellent membrane filter; and
    at least one cooling device to build up an airflow in the housing and to lead the filtered cooling air, which is heated up because of flowing through the electrical subassemblies, out of the housing through at least one air outlet.

2. The cooling arrangement as claimed in claim 1, further comprising an air guide device arranged respectively underneath and/or above the electrical subassemblies, to guide the filtered cooling air through one electrical subassembly in each case.

3. The cooling arrangement as claimed in claim 1, further comprising an air guide device arranged respectively underneath and/or above the electrical subassemblies, to shield the electrical subassemblies.

4. The cooling arrangement as claimed in claim 1, wherein said at least one cooling device comprises a motor-driven fan wheel.

5. The cooling arrangement as claimed in claim 4, further comprising a control device to control the motor speed of said at least one cooling device as a function of the temperature in the interior of the housing and/or of the temperature of the cooling air flowing in.

6. The cooling arrangement as claimed in claim 5, wherein said control device controls said at least one cooling device in such a way that the direction of the air flow in the housing is reversed, so that cooling air flows in through the at least one air outlet and is led out through the membrane filter, the membrane filter being freed of deposited dirt particles by the cooling air flowing out.

7. The cooling arrangement as claimed in claim 1, wherein the air inlet is arranged in a side and/or bottom area of the housing in such a way that the cooling air flowing in acts on the undersides of the electrical subassemblies.

8. The cooling arrangement as claimed in claim 1, wherein the at least one air outlet for leading the filtered and heated cooling air out is arranged in an upper and/or side area of the housing.

9. A base station for a system selected from a mobile telephone system and an access network system, said base station having a housing containing electrical subassemblies, said housing having at least one air inlet and at least one air outlet, and an arrangement for cooling the electrical subassemblies, said arrangement comprising:

at least one water-repellent membrane filter having a surface arranged in said at least one air inlet of the housing for the surface filtration of dirt particles and water from the cooling air flowing in said at least one air inlet, said surface filtration of dirt particles and water occurring at the surface of said at least one water repellent membrane filter; and at least one cooling device to create an airflow in the housing to lead the filtered cool air, after being heated up because of flowing through the electrical subassemblies, out of said at least one air outlet.

10. A base station according to claim 9, further comprises an air guide device being arranged respectively adjacent each electrical subassembly to guide the filtered cooling air through one electrical subassembly in each case.

11. A base station according to claim 9, further comprising an air guide device arranged adjacent each electrical subassembly to shield the electrical subassembly.

12. A base station according to claim 9, wherein said at least one cooling device comprises a motor-driven fan wheel.

13. A base station according to claim 12, further comprising a control device to control a motor speed of the motor-driven fan wheel as a function of the temperature in the interior of the housing and the temperature of the cooling air flowing into the at least one air inlet.

14. A base station according to claim 13, wherein said control device controls said at least one cooling device in such a way that the direction of the airflow in the housing can be reversed, so that cooling air flowing in through the at least one air outlet is directed through said at least one water-repellent membrane filter to free said at least one water-repellent membrane filter of deposited dirt particles.

15. A base station according to claim 9, wherein the at least one air inlet is arranged in an area adjacent a bottom area of the housing so that the cooling air flowing in through the at least one air inlet acts on the underside of the electrical subassemblies.

16. A base station according to claim 9, wherein the at least one air outlet is arranged in an upper region of the housing.

17. An apparatus comprising:

a housing containing at least one electrical subassembly, said housing having at least one air inlet and at least one air outlet;

at least one combination water repellent and dirt particle filter arranged in the at least one air inlet to filter cooling air flowing into the housing to cool the at least one electrical subassembly;

at least one cooling device to cause the cooling air to flow through the at least one electrical subassembly and through the at least one air outlet; and a control device controlling said at least one cooling device to reverse the direction of the air flow in the housing, so that the cooling air flows in through the at least one air outlet, through said at least one combination water repellent and dirt particle filter and through the at least one air inlet to free said at least one combination water repellent and dirt particle filter of deposited dirt particles.

18. A base station for a system selected from a mobile telephone system and an access network system, comprising:

a housing containing electrical subassemblies, said housing having at least one air inlet and at least one air outlet;

at least one combination water repellent and dirt particle filter arranged in the at least one air inlet of said housing to filter cooling air flowing in the at least one air inlet;

at least one cooling device to cause the filtered cooled air to flow through the electrical subassemblies and out of the at least one air outlet; and a control device controlling said at least one cooling device to reverse the direction of the air flow in said housing so that the cooling air flows in through the at least one air outlet and is directed to said at least one combination water repellent and dirt particle filter to free said at least one combination water repellent and dirt particle filter of deposited dirt particles.

19. A cooling arrangement for an apparatus having a single housing containing electrical subassemblies, comprising:

at least one water-repellant membrane filter having a surface arranged in an air inlet of the single housing for surface filtration of dirt particles and water from cooling air flowing into the single housing for cooling the electrical subassemblies, said surface filtration of dirt particles and water occurring at the surface of said at least one water repellent membrane filter; and at least one cooling device to build up an air flow in the single housing and to lead the filtered cooling air, which is heated up because of flowing through the electrical subassemblies, out of the single housing through at least one air outlet.

* * * * *